US008436340B2

(12) United States Patent
Napolitano et al.

(10) Patent No.: US 8,436,340 B2
(45) Date of Patent: May 7, 2013

(54) CROSS-POINT CELL NANOARRAY WITH ANISOTROPIC ACTIVE ORGANIC LAYER

(75) Inventors: Teresa Napolitano, Cimitile (IT); Claudio De Rosa, Naples (IT); Finizia Auriemma, Naples (IT); Odda Ruiz De Ballesteros, Naples (IT); Giovanni Palomba, Torre Annunziata (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 607 days.

(21) Appl. No.: 12/638,854

(22) Filed: Dec. 15, 2009

(65) Prior Publication Data
US 2010/0155690 A1    Jun. 24, 2010

(30) Foreign Application Priority Data

Dec. 18, 2008    (IT) ............. VA2008A0065

(51) Int. Cl.
*H01L 51/30*    (2006.01)
*H01L 51/40*    (2006.01)

(52) U.S. Cl.
USPC ............ 257/40; 257/E51.025; 257/E51.027; 438/99; 438/780

(58) Field of Classification Search ........... 257/E39.007, 257/E51.025, E51.024, E51.027, E51.036, 257/E51.047, E51.048
See application file for complete search history.

(56) References Cited

U.S. PATENT DOCUMENTS

| | | | | |
|---|---|---|---|---|
| 6,054,507 | A * | 4/2000 | Funaki et al. | 523/210 |
| 6,541,557 | B1 * | 4/2003 | Hasegawa et al. | 524/413 |
| 6,565,965 | B1 * | 5/2003 | Harada et al. | 428/328 |
| 6,893,705 | B2 * | 5/2005 | Thomas et al. | 428/141 |
| 7,485,492 | B2 * | 2/2009 | Vecchione et al. | 438/106 |
| 7,545,241 | B2 * | 6/2009 | Wakabayashi et al. | 333/238 |
| 7,863,376 | B2 * | 1/2011 | Costanzo et al. | 525/50 |

(Continued)

FOREIGN PATENT DOCUMENTS

| | | |
|---|---|---|
| EP | 1 513 159 A2 | 3/2005 |
| WO | 2007136350 A1 | 11/2007 |

OTHER PUBLICATIONS

Park et al., Controlled Ordering of Block Copolymer Thin Films by the Addition of Hydrophilic Nanoparticles, Macromolecules, vol. 40, 2007, pp. 8119-8124.*

(Continued)

*Primary Examiner* — David Vu
*Assistant Examiner* — Earl Taylor
(74) *Attorney, Agent, or Firm* — Seed IP Law Group PLLC

(57) ABSTRACT

A cross-point cell nanoarray comprises a mechanical support substrate, first and second orders of uniformly spaced parallel electrodes separated by an electrically active organic film and orthogonally arranged to form an array of cross-point cells, individually addressable by biasing the respective opposite electrodes, by selecting them among those of the respective orders, over a planar area of the substrate. The active organic resin layer includes a block copolymer of a major component resin and of at least one different minor component resin, configured to promote formation of large-scale ordered nanostructures through phase segregation, due to block incompatibility and self-assembly properties of the blocks. Polymeric bocks of the ordered nanostructures configured to sequester conductive nanoparticles and/or conductive nanoparticle clusters originally dispersed in the component organic resins, subtracting them from the surrounding matrix copolymer. Preferential electric current paths across the thickness of the active organic layer at cross-over points are thus created.

20 Claims, 18 Drawing Sheets

U.S. PATENT DOCUMENTS

| | | | |
|---|---|---|---|
| 8,083,953 B2 * | 12/2011 | Millward et al. | 216/2 |
| 8,101,261 B2 * | 1/2012 | Millward et al. | 428/105 |
| 8,114,300 B2 * | 2/2012 | Millward | 216/2 |
| 8,114,468 B2 * | 2/2012 | Sandhu et al. | 427/98.4 |
| 8,133,534 B2 * | 3/2012 | Stoykovich et al. | 427/256 |
| 8,236,902 B2 * | 8/2012 | Hogen-Esch et al. | 525/326.4 |
| 2003/0218896 A1 * | 11/2003 | Pon et al. | 365/63 |
| 2004/0180988 A1 * | 9/2004 | Bernius et al. | 523/160 |
| 2005/0211978 A1 * | 9/2005 | Bu et al. | 257/40 |
| 2005/0212022 A1 * | 9/2005 | Greer et al. | 257/296 |
| 2006/0131569 A1 * | 6/2006 | Choi et al. | 257/40 |
| 2006/0134556 A1 * | 6/2006 | Nealey et al. | 430/311 |
| 2007/0188275 A1 * | 8/2007 | Wakabayashi et al. | 333/238 |
| 2007/0243679 A1 * | 10/2007 | Vecchione et al. | 438/253 |
| 2008/0226995 A1 * | 9/2008 | Costanzo et al. | 430/8 |
| 2008/0299353 A1 * | 12/2008 | Stoykovich et al. | 428/195.1 |
| 2009/0146202 A1 * | 6/2009 | Leong et al. | 257/315 |
| 2009/0200646 A1 * | 8/2009 | Millward et al. | 257/632 |
| 2009/0236309 A1 * | 9/2009 | Millward et al. | 216/39 |
| 2009/0240001 A1 * | 9/2009 | Regner | 525/95 |
| 2010/0148156 A1 * | 6/2010 | Jang et al. | 257/40 |
| 2010/0155690 A1 * | 6/2010 | Napolitano et al. | 257/5 |
| 2012/0076978 A1 * | 3/2012 | Millward et al. | 428/120 |

OTHER PUBLICATIONS

Li et al., Self-assembled diblock copolymer thin films for the analysis of bacteria-surface interactions, Proc. of SPIE, vol. 7270, 2008, pp. 1-8.*

Raoux et al., Phase-change random access memory: A scalable technology, IMB J. Res. & Dev., vol. 52, No. 4/5, 2008, pp. 465-479.*

Bates et al., "Block Copolymer Thermodynamics," Annu. Rev. Phys. Chem. 41:525-557, 1990.

Bockstaller et al., "Block Copolymer Nanocomposites: Perspectives for Tailored Functional Materials," Adv. Mater. 17:1331-1349, 2005.

Coates et al., "Catalysts for the Living Insertion Polymerization of Alkenes: Access to New Polyolefin Architectures Using Ziegler—Natta Chemistry," Angew. Chem. Int. Ed. 41:2236-2257, 2002.

De Rosa et al., "Microdomain patterns from directional eutectic solidification and epitaxy," Nature 405:433-437, May 25, 2000.

Hamley I.W., "Developments in Block Copolymer Science and Technology." Chapter 1, pp. 1-29. (2004) John Wiley & Sons, Ltd.

Henisch et al., "Switching in organic polymer films," Applied Physics Letters 24(12):589-591, Jun. 15, 1974.

Lazzari et al., "Block Copolymers as a Tool for Nanomaterial Fabrication," Adv. Mater. 15(19):1583-1594, Oct. 2, 2003.

Lazzari et al., "Block Copolymers in Nanoscience," Chapter 9, pp. 191-231. (2006) Wiley-VCH Verlag GmbH & Co.

Leibler, L., "Theory of Microphase Separation in Block Copolymers," Macromolecules 13:1602-1617, 1980.

Mansky et al., "Monolayer films of diblock copolymer microdomains for nanolithographic applications," J. Mater. Sci 30(8):1987-1992, 1995.

Mikolajic et al., "The Future of Nonvolatile Memories," Infineon Technologies Dresden, IFDD MDC TIN.

Ouyang et al., "Electric-field-induced charge transfer between gold nanoparticle and capping 2-naphthalenethiol and organic memory cells," Applied Physics Letters 86(12), 2005.

Ouyang et al., "Programmable polymer thin film and non-volatile memory device," Nature Materials 3, Dec. 2004.

Park et al., "Block Copolymer Lithography: Periodic Arrays of ~10^11 Holes in 1 Square Centimeter," Science 276:1401-1404, 1997.

Park et al., "Enabling nanotechnology with self assembled block copolymer patterns," Polymer 44:6722-6760, 2003.

Segui et al., "Switching in polystyrene films: Transition from on to off state," Journal of Applied Physics 47(1):140-143, Jan. 1976.

Uplaznik, M., "Introduction to nanotechnology—soft lithography," University of Ljubljana, Faculty of Mathematics and Physics, Department of Physics, Mar. 2002.

Xia et al., "Soft Lithography," Annu. Rev. Mater. Sci. 28:153-184, 1998.

Xia et al., "Soft Lithography," Angew. Chem. Int. Ed. 37:550-575, 1998.

Yang et al., "Electrical Switching and Bistability in Organic/Polymeric Thin Films and Memory Devices," Adv. Funct. Mater. 16:1001-1014, 2006.

* cited by examiner

| Nature of patterns | Spheres (SPH) (3D) | Cylinders (CYL) (2D) | Double gyroid (DG) (3D) | Double diamond (DD) (3D) | Lamellae (LAM) (1D) |
|---|---|---|---|---|---|
| Space group | $Im\bar{3}m$ | $p6mm$ | $Ia\bar{3}d$ | $Pn\bar{3}m$ | $pm$ |
| Shaded domains: A block |  |  |  |  | |
| Volume fraction of A block | 0–21% | 21–33% | 33–37% | | 37–50% |

(a)

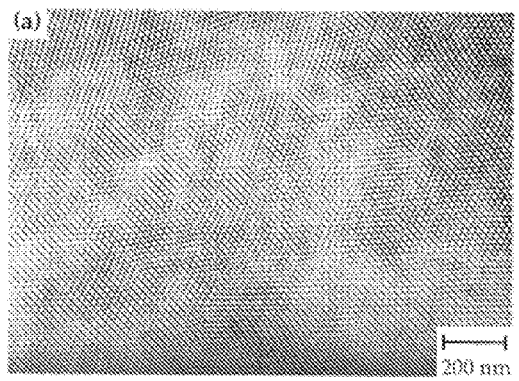
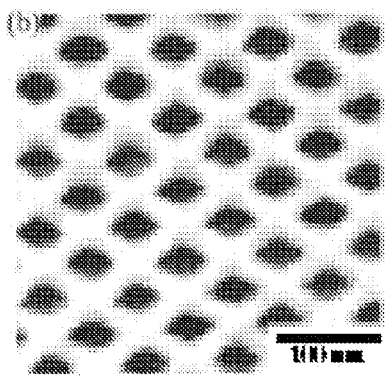
FIG. 15              FIG. 16
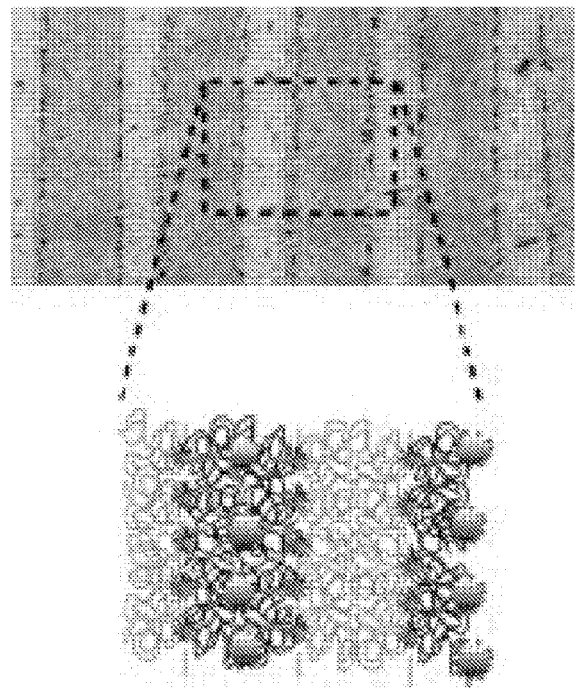
FIG. 17

CROSS-POINT CELL NANOARRAY WITH ANISOTROPIC ACTIVE ORGANIC LAYER

BACKGROUND

1. Technical Field

The present disclosure relates to cross-point nanoarrays which can be used as non-volatile memory structures or as sensors able to be produced using non-conventional lithographic techniques including so-called "soft-lithography".

2. Description of the Related Art

As is known, non-volatile memories, i.e., memories which are able to retain the stored data even in the absence of a power supply, are today widespread in many areas of electronics. These devices, at present, are formed on silicon substrates using highly advanced technology which is well-established in particular form the point of view of the reliability and compactness achieved: today the technological challenge is to produce memories using a technology with definition lines having a width of 65 nm and even finer.

The cell structure generally has as a memory element a floating gate which is arranged underneath a control gate electrode; operation of the device is associated specifically to the combined biasing of the two gates which are separated by dielectric and arranged over a channel region in the semiconductor between source and drain. The data to be stored physically consists of the electric charge that is accumulated in the floating gate.

The rapid growth of the memory market is providing an impetus for the development of alternative non-volatile memory structures which are potentially able to overcome the technological limits of scalability of silicon structures at an acceptable cost and improve the performance in terms of read/write speed, data retention time, and reduction of the voltages employed during reading and writing [1].

At present various alternative structures which can be used as a non-volatile memory are being studied, as schematically shown in FIG. 1.

Among the structures studies, the most promising, in terms of integrative possibilities, are organic memories which use polymer materials as the active material and in particular wholly organic memories (i.e., memories which can be produced exclusively with organic materials) and hybrid memories (i.e., memories which can be produced using conventional materials, for example ordinary conductive materials in combination with organic materials).

These memory cells may be made with particularly simple structures (so-called cross-point array structures), as schematically shown in the diagram of FIG. 2, and in some cases arranged in vertical stacks, as schematically shown in FIG. 3, being thus possible to multiply the memory density per unit of footprint area. Moreover, organic memories are the only memories which are in theory capable of allowing scaling down to molecular dimensions and therefore potentially achieving an extraordinary degree of compactness.

In these memory structures, an active organic material is arranged between two electrodes made of a conductive material which can be defined in the form of parallel nanorows in a simple cross-point matrix arrangement.

In the area of organic memories there exist two different types of operation, i.e., based on ferroelectric behavior and resistive switching operation, which are illustrated in FIGS. 2 and 3, respectively.

Of these two different types, the most advantageous in terms of compactness are resistive switching memories since, in the case of ferroelectric memories, an auxiliary transistor is associated to each cell to avoid data loss during reading.

Therefore, cross-point nanoarrays, such as those shown in FIGS. 2 and 3, which are based on modification of the electric resistance through the layer of active organic material that separates the electrodes of the two separate orthogonal orders of electrodes, at the cross-over points, may be useful not only as a non-volatile memory structure, but even as a sensing structure, for example able to detect pressure patterns over a relatively large area, for producing user interfaces, for example in the form of keyboards and for similar uses.

Dual-Electrode Polymer Devices

A two-electrode device may be simply produced by means of a sandwich structure comprising a bottom electrode (consisting of Al, Ag, Cu, Ni, doped polysilicon, etc.), a layer of active polymer material deposited for example by means of spin-coating, and a top electrode (consisting of Al, Ag, Cu, Ni, doped polysilicon, etc.) formed for example by CVD (Chemical Vapor Deposition).

A device of this type may function as a memory element for example by applying an electric field across the active organic material at a cross-over point (cell), able to induce formation of conductive paths in the active polymer material or activate a charge transfer or other detectable modification which can be detected in the organic material. Below few examples of polymer materials, their structures, characteristics and the operating principles of devices using them as active materials are given.

Polystyrene

The behavior of atactic polystyrene film between two metal (Al, Au, etc.) electrodes as a non-volatile memory element was already studied in 1976 by Carchano and colleagues [2]. The I-V characteristics demonstrate a transition from a high-resistance state (108 Ohms) to a low-resistance state (10 Ohms) and the reverse transition after the application of a suitable difference in potential. According to the authors, the switching transition between the two states was due to the formation of conductive strands consisting of carbon atoms (C=C) in the polymer between the electrodes.

The most recent research into conductive polymers relate to polystyrene film containing metallic nanoclusters.

Yang Yang et al. [3][4][5] have studied the operation of devices obtained by depositing an organic film between two Al electrodes, as shown in FIG. 4.

The organic film is formed by depositing by means of spin-coating a solution of Au nanoparticles passivated with 1-dodecanthiol (Au-DT NPs, diameter 1.6-4.4 nm), 8-hydroxyquinoline (8HQ) and polystyrene in 1,2-dichlorobenzene [3]. FIG. 5 show the chemical structures of the materials used.

The bottom electrode and top electrode are thermally deposited from vapor phase, while the active layer is deposited from a solution of 0.4% wt % Au-DT NPs, 0.4 wt % 8HQ and 1.2 wt % polystyrene in 1,2-dichlorobenzene. Upon application of an electric field, the device undergoes a transition between two conductive states and may be written, read and erased repeatedly as shown in FIG. 6.

The presence of two different conductive states suggests a change in the distribution of the electrons of the device owing to the action of the electric field. The 8HQ molecules and Au nanoparticles behave as electron donors and electron acceptors, respectively, such that the electric field activates a charge transfer between Au-DT NP and 8HQ. Prior to the transition, there is no interaction between the two domains, but when an electric field is applied to the device, an electron of the highest occupied molecular orbital (HOMO) of the 8HQ is able to pass through the dodecanthiol passivation layer to the Au nanoparticle, as schematically illustrated in FIG. 7.

The most interesting characteristics of this mechanism are the stability of the two states, the fast switching response, the high ON/OFF ratio (105) and the ample opportunity to vary the materials owing to the simplicity of the manufacturing processes. The effect of various materials on the performance of the devices, substituting 8HQ with another conjugated organic compound, 9,10-demethylanthracene, and the aPS with polymethyl methacrylate PMMA was also studied. The resultant devices had an electrical behavior substantially similar to that described above.

The use of different conductive materials, such Au, Cu and ITO, instead of Al, for the electrodes also did not have a decisive effect on the performance of the device.

A WORM (write-once-read-many-times-memory) memory device, consisting of a polystyrene film containing Au nanoparticles passivated with 2-naphthalenethiol (AU-2NT NPs), the structure of which is shown in FIG. 8, was also produced and inserted between Al electrodes [4].

From an analysis of the I-V characteristic of this device shown in FIG. 3 it can be seen that, owing to the effect of the electric field, the device passes from a low conductivity state, where the current which flows through the device depends on the injection of charge from the electrode to the polymer material and is limited by the barrier present at the metal-polymer interface, to a higher conductivity state, where the current is associated with the formation of an excess charge in the organic layer situated between the two electrodes (space-charge-limited current region). The increase in the current between the two states, measured at about 2V, is greater than three orders of magnitude. Upon reversing the polarity of the electric field there was no transition to the "0" state, but instead a significant increase in the absolute value of the current, thereby confirming the existence of a space-charge-limited current regime.

This transition between the two conduction states was reasonably attributed to the activation of a charge transfer by the electric field between the Au nanoparticles and the 2-NT film which passivates them as schematically shown in FIG. 10. In view of the stability of the device in the higher conductivity state, it may be used as a WORM memory.

Polymethyl Methacrylate

The behavior of polymethyl methacrylate, polyethyl methacrylate and polybutyl methacrylate film between two metal electrodes (Al, Au, etc.) for use in non-volatile memory devices was already studied in 1974 [6]. FIG. 11 shows the result obtained on a film with a thickness of about 0.5 μm deposited between two metal electrodes from a solution containing 5% PMMA from butanone or benzene. As in the case of atactic polystyrene, the authors suggest that switching is induced by the formation in the polymer of conductive strands of carbon atoms (C═C) between the electrodes.

The most recent research into the derivatives of methyl methacrylate relate to the use of polymethyl methacrylate film as a material for the matrix containing metal nanoparticles or derivatives of polymethacrylate functionalized with pendant chromophores such as anthracene, poly(methyl-methacrylate-co-9-anthracenyl-methylmethacrylate) (10:1), MDCPAC. The use of these polymers allows the excellent mechanical properties of polymethacrylate to be combined with the interesting electronic characteristics of anthracene.

The device is formed by means of vapor phase deposition of the bottom Au electrode on a glass substrate, followed by deposition of the active MDCPAC layer by means of spin-coating from a solution of chloroform (20 mg/mL in ClCH3) and finally vapor phase deposition of the second Al electrode.

The I-V characteristic of such a device is shown in FIG. 12a and FIG. 12b The first graph (FIG. 12a) shows the characteristic of a circuit consisting of the memory device in series with a 107Ω resistance, from where it can be seen that when V=Vcrit the device switches between two states (OFF and ON).

When V<Vcrit the current in the circuit is essentially controlled by the device which has a resistance greater than 107Ω, corresponding to an OFF state. When V>Vcrit, the current in the circuit is controlled essentially by the resistor in series with the device, which is therefore in a lower resistivity state (ON). If the voltage applied is reduced the device remains in the ON state until V=Vhold, which is the erase voltage.

BRIEF SUMMARY

The impossibility or rather the technological limits which in practice make it difficult to pattern the active organic film by an appropriate etch or ablation technique such to leave it solely in coincidence with the projected cross-over areas of electrodes belonging to the two orthogonal orders of spaced parallel electrodes (single cell areas), gives rise to considerable cross-talk between adjacent cells (cross-over points) in the array.

The phenomenon of cross-talk due to the impossibility/technological difficulty of being able to provide for the presence of an electrically active film of organic material solely in the cross-over areas (cells), in addition to being a major obstacle to achieving cross-point nanoarrays with the technological minimum definition width of the conductive nanowires (spaced parallel electrodes), nowadays of about 40-60 nanometers, often may results in the need for specific read and write algorithms capable of resolving intelligibility uncertainties caused by the cross-talk phenomenon.

One embodiment is an improved cross-point nanoarray without cross-talk or at least with a much smaller amount of residual cross-talk between adjacent cells.

One embodiment is a cross-point nanoarrays with a greater degree of compactness compared to that which has been possible hitherto, and with improved cross-talk characteristic.

Another object of the present disclosure is to provide an improved process for manufacturing a cross-point nanoarray.

One embodiment is a cross-point memory having an active organic layer that is not isotropic but has a marked anisotropy.

The active organic layer separating the two orders of mutually orthogonal electrodes contains nanostructures or polymer domains that are oriented in a direction orthogonal to the plane of the active organic separation layer and which extend through the thickness of the organic layer between the opposite surfaces of the electrodes in the cross-over zones.

These nanostructures or polymer domains are formed spontaneously in the organic matrix layer consisting of a mixture of materials, one of the key components of which is a block copolymer, able to produce nanostructures ordered on a large scale through a phase separation mechanism due to incompatibility among polymer blocks and through a self-assembly mechanism (i.e., the ability of spontaneously organizing/reordering themselves), coupled to the capacity of these ordered domains to sequester nanoparticles of conductive material and/or clusters of nanoparticles (originally dispersed homogeneously in the resin mix), subtracting them from the surrounding matrix resin of the layer.

Polymer nanostructures or domains, ordered in a substantially large-scale and preferably also having a prevalent common orientation in a transverse direction relative to the plane of the layer, that have the characteristic of becoming enriched of conductive nanoparticles and/or nanoclusters thereof, create innumerable current paths across the thickness of the active organic layer from one electrode to the other electrode opposite thereto, at any cross-point, the local conductivity (resistance) of which may be significantly modified by biasing the purposely selected opposite electrodes of the two orders.

BRIEF DESCRIPTION OF THE SEVERAL VIEWS OF THE DRAWINGS

FIGS. 15 and 16 are TEM bright-field images of thin films of a triblock copolymer polystyrene-b-polyisoprene-b-poly-methylmethacrylate (a) and a star copolymer polystyrene-b-polyisoprene-b-polymethylmethacrylate (b), after staining with $OsO_4$.

FIG. 17 is a bright-field TEM image of a thin film of a diblock copolymer polystyrene-poly(ethylene-co-propylene) in which passivated gold nanoparticles are included in the polystyrene layers alone.

DETAILED DESCRIPTION

In order to explain better certain operating mechanisms, methods for producing nanoarrays and results and features of the novel devices according to the disclosure, it is considered useful to describe in general the block copolymers and their features and, by way of non-limiting examples, also some organic materials which can be used to produce cross-point nanoarrays according to the present disclosure.

Block Copolymers

Figure 1:
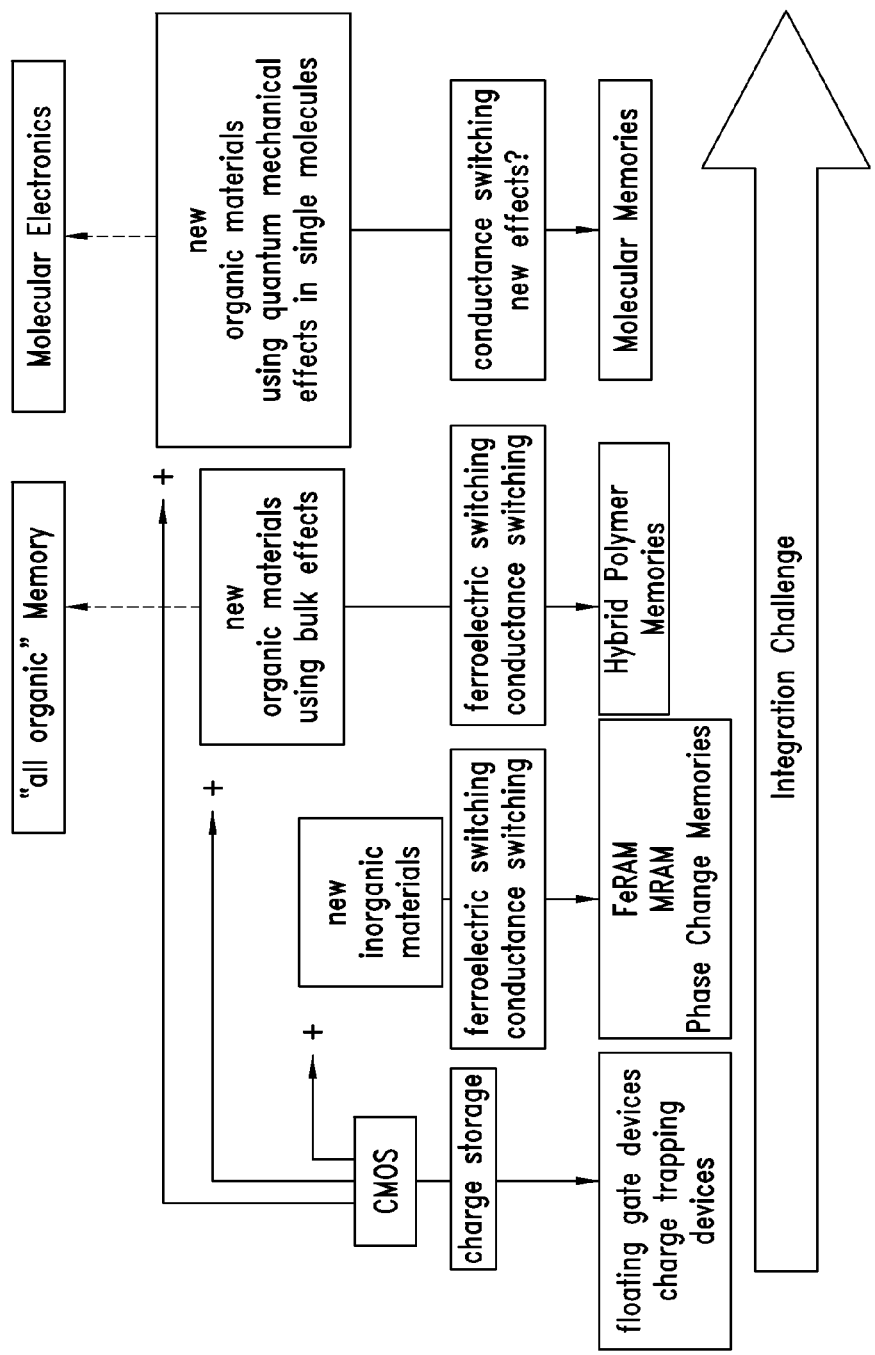
FIG. 1 illustrates the various areas of research being conducted at present and the problems to be solved in order to progress from conventional non-volatile memories to memories with a novel design.
Figure 3:
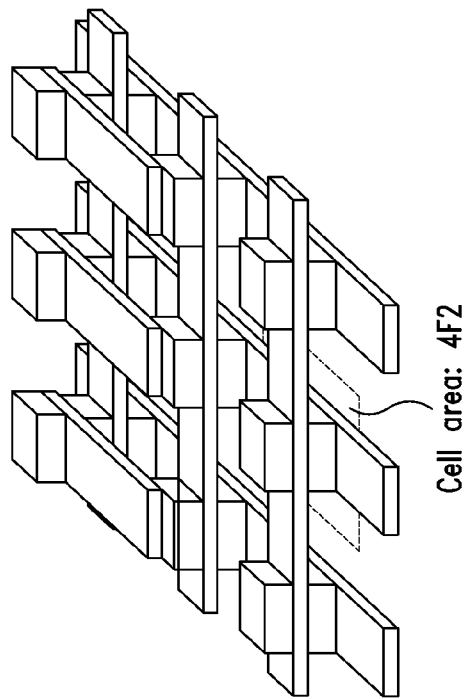
FIG. 3 illustrates the easy stacking capability of the cross-point arrays.
Figure 2:
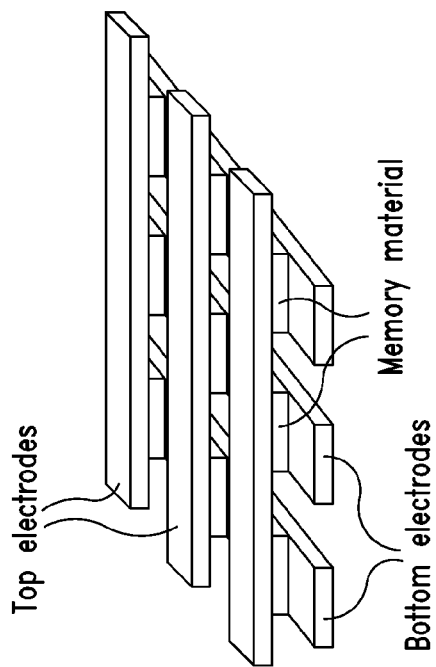
FIG. 2 illustrates the structural simplicity of a cross-point array.
Figure 4:
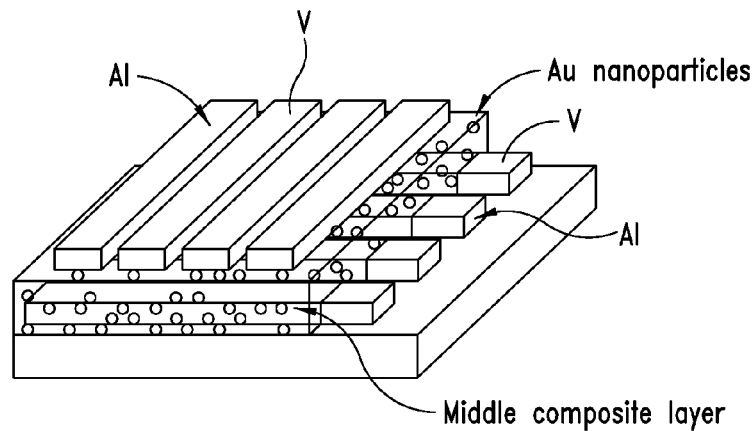
FIG. 4 shows the basic structure of a cross-point memory device using an organic film containing gold nanoparticles.
Figure 5:
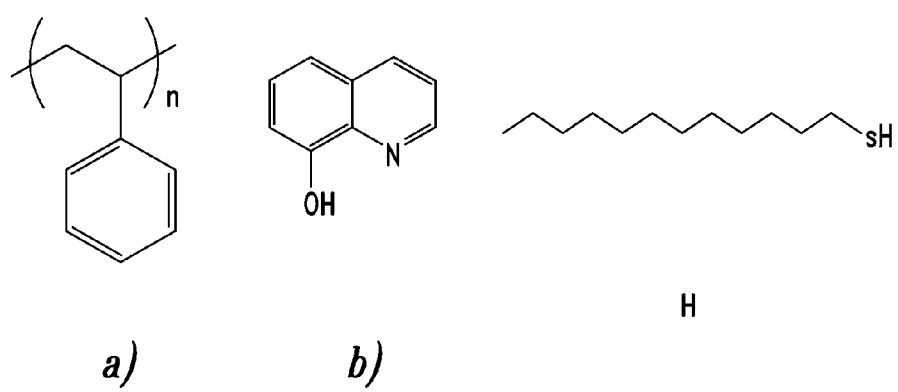
FIG. 5 shows the chemical structures of a) polystyrene, b) 8-hydroxyquinoline and c) 1-dodecanthiol.
Figure 6:
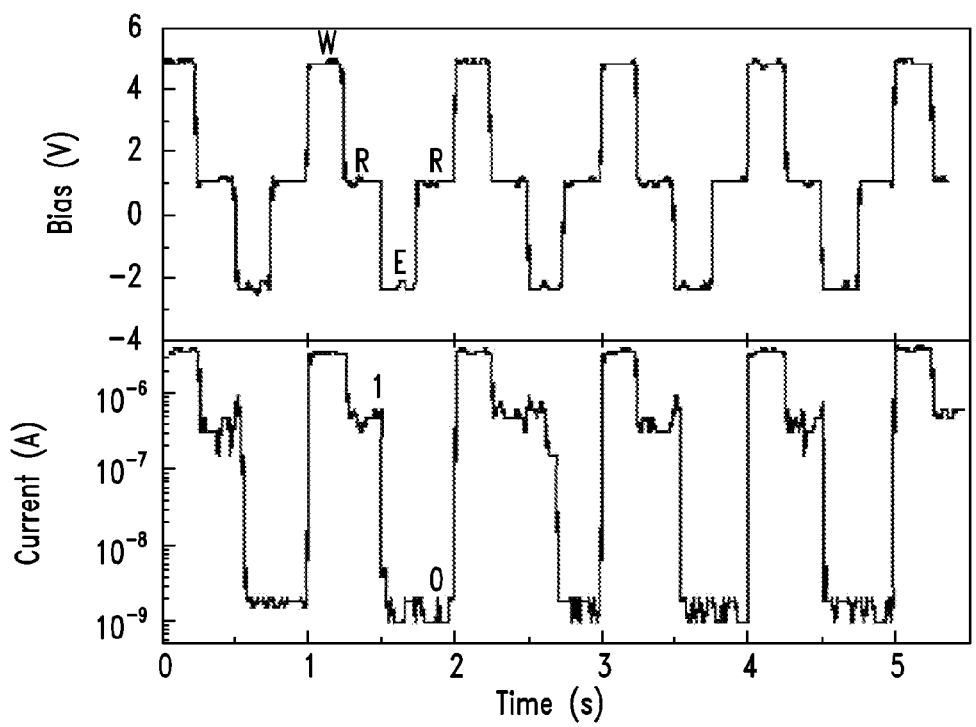
FIG. 6 shows read-write-erase cycles of an Al/Au-DT+ 8HQ+PS/Al device.
Figure 7:
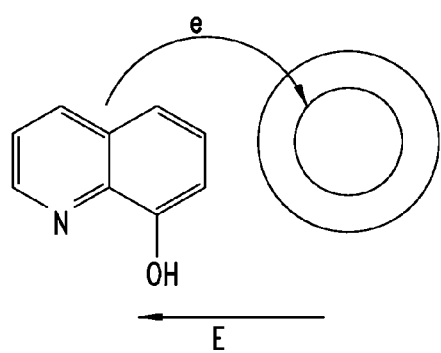
FIG. 7 shows the mechanism for transferring the electrons from the 8HQ to the Au nanoparticles.
Figure 8:
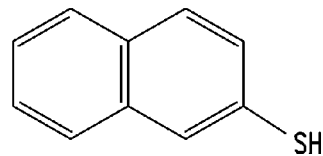
FIG. 8 shows the chemical structure of 2-naphthalenethiol.
Figure 9:
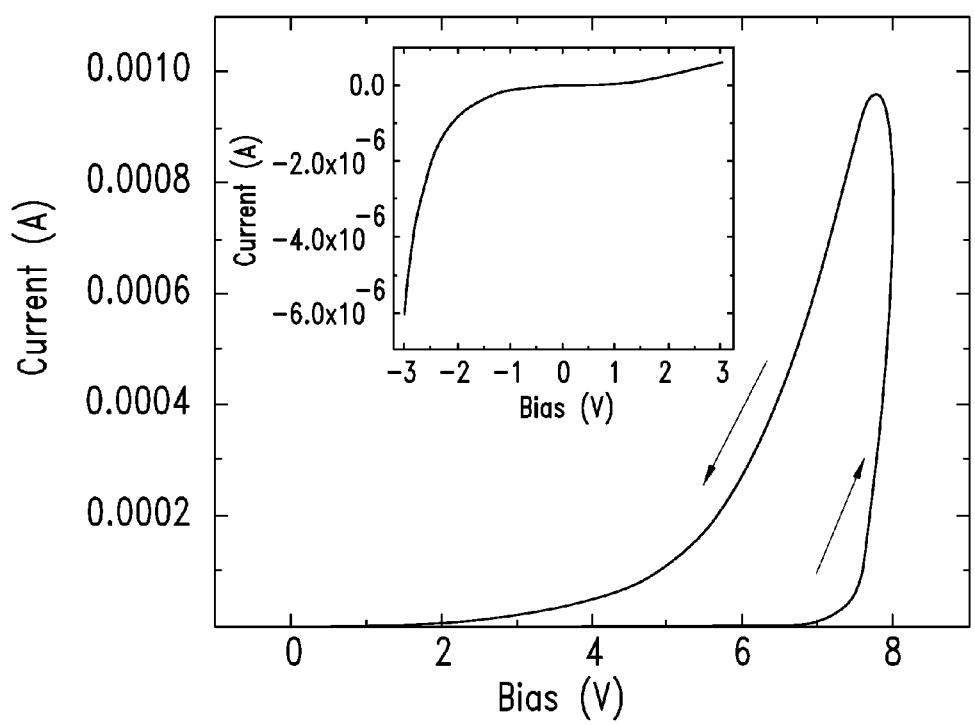
FIG. 9 shows the I-V characteristic of Al/Au-2NT NPs+ PS/Al for positive voltage values and, in the inset, the curve for negative voltage values.
Figure 10:
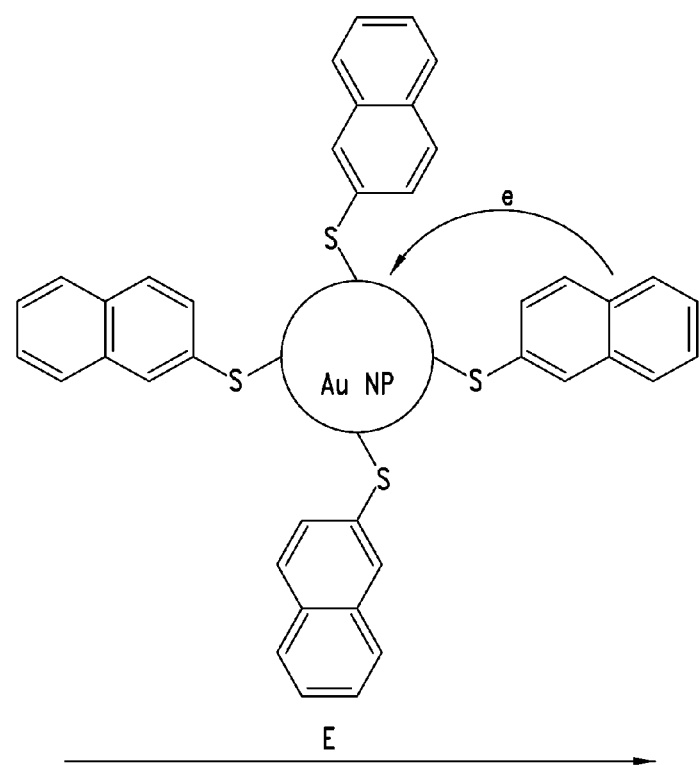
FIG. 10 shows the diagram for transfer of the electrons from the 2-NT to the Au nanoparticles.
Figure 11:
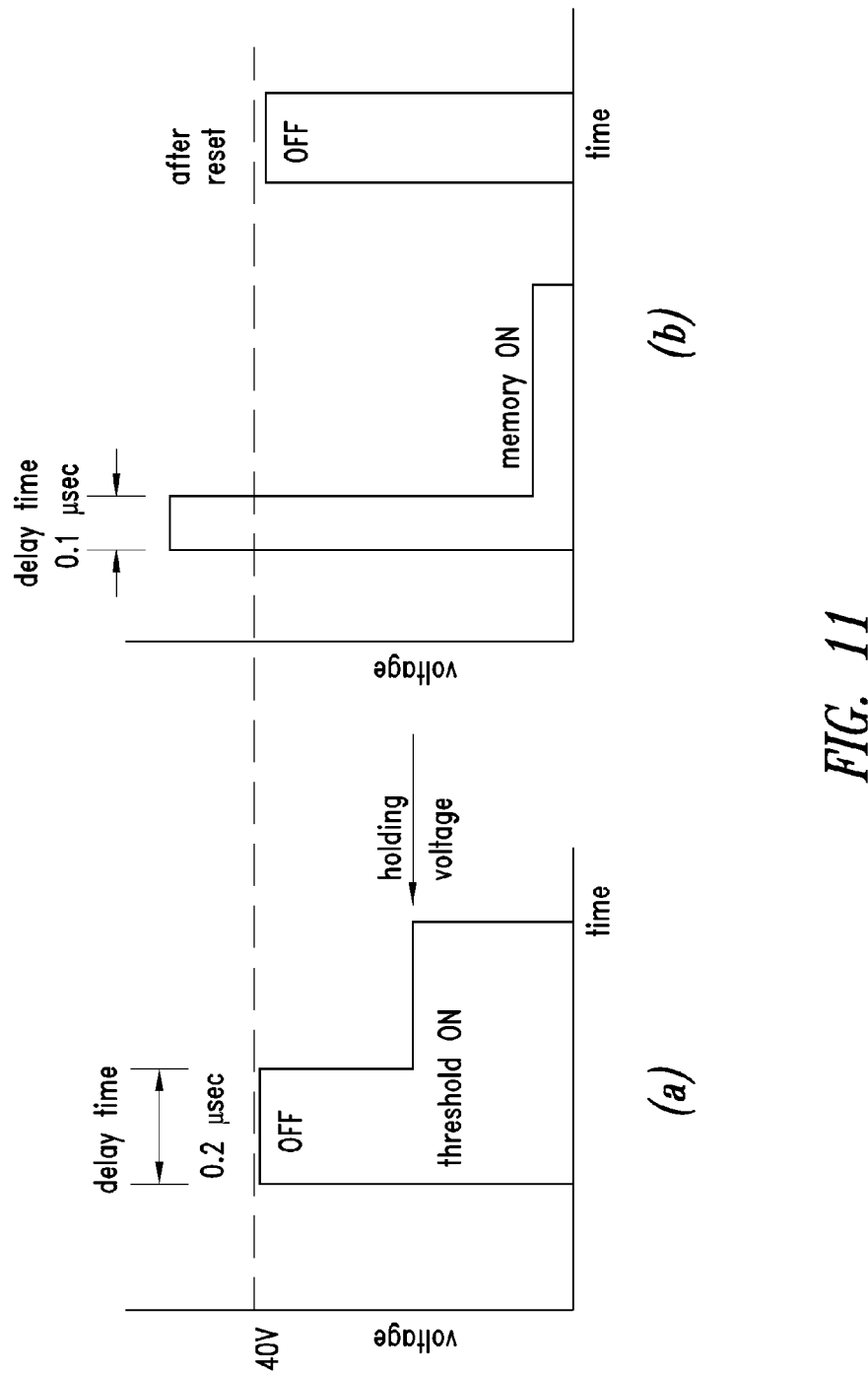
FIG. 11 is a schematic representation of a switching process in a PMMA device.
Figure 12:
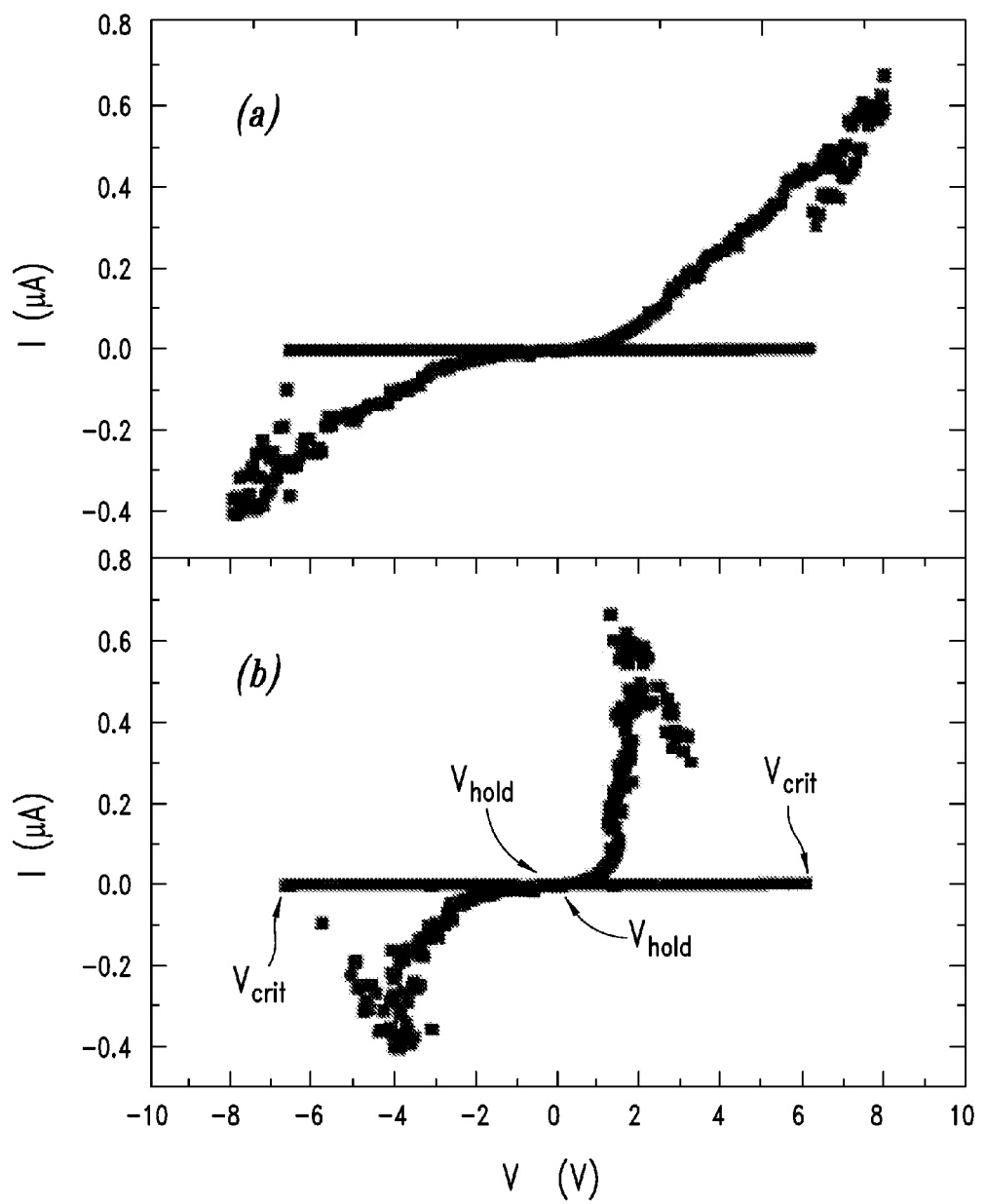
FIG. 12 shows in section a) the I-V characteristic of an Au/MDCPAC/Al device in series with a $107\Omega$ resistance, and in section b) the calculated I-V characteristic of the device.
Figure 13:
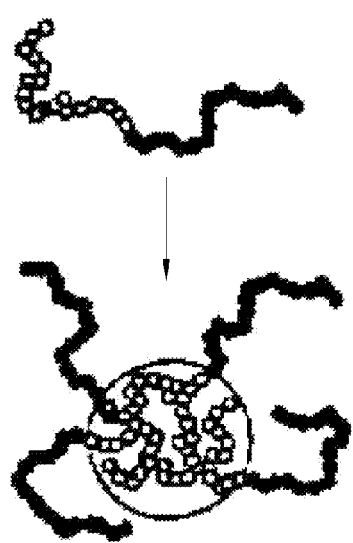
FIG. 13 is a diagram illustrating self-assembly in block copolymers.

Block copolymers are—generally amorphous—polymer materials in which the individual macromolecules consist of at least two different chemically bonded polymer chains (blocks). If the two polymer blocks are chemically incompatible, phase separation occurs, with spontaneous segregation of the different macromolecules into different microdomains as schematically shown in FIG. 13.

This so-called "self-assembly" phenomenon results in the spontaneous formation of nanostructures [7]. A compromise between the tendency for phase separation and chemical connectivity may result in the formation of periodic structures in which both the periodicity and the size of the domains depend on the lengths of the blocks and therefore the molecular masses.

Different microstructures are obtained depending on the chemical nature of the blocks and the associated molecular masses. The fundamental variables which define the type of nanostructure which is formed by means of self-assembly are as follows: the Flory Huggins χ interaction parameter, which defines the degree of incompatibility of the blocks, and the volume fraction of the blocks φ, which depends on the relative length of the blocks [7].

Figure 14:
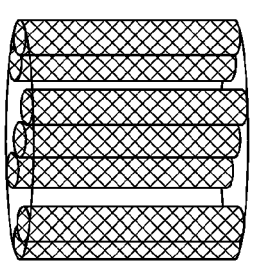
FIG. 14 shows the different microstructures which are generated by means of self-assembly in AB diblock copolymers (a) and in ABC triblock copolymers (b), depending on the volume fraction of the minor component.
Figure 14:
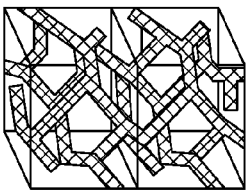
Figure 14:
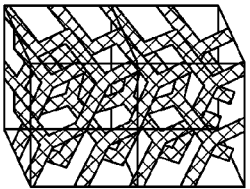
Figure 14:
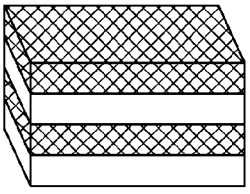
Figure 14:
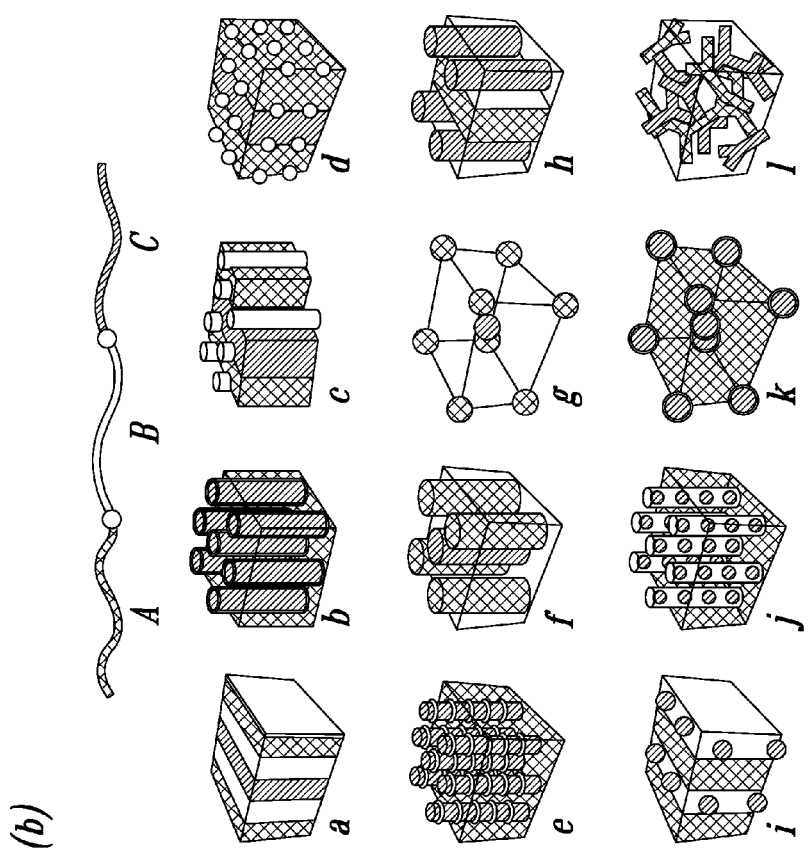

FIG. 14 shows classic microstructures found for diblock copolymers (a) and triblock copolymers (b)[7][8].

In the case of diblock copolymers, the minor component of lower molecular weight segregates into spheres when its volume fraction is less than 20% and into cylinders when the volume fraction lies between 21 and 33%. Instead, alternating lamellae are obtained in the case of symmetrical block copolymers where the molecular masses of the two blocks are comparable. Finally, bicontinuous network structures (double gyroid and double diamond) are obtained within a limited formation range (volume fraction of 33-37%) [7][8]. In the case of triblock copolymers the combination of the different formation sequences ABC, ACB, BAC and overall molecular mass provides an enormous quantity of parameters, allowing the creation of numerous new morphologies, as shown in part b) of the figure.

A first characteristic of these systems, exploited in the practice of an embodiment of this disclosure, is that the microdomains spontaneously formed by means of equally spontaneous self-assembly tend to be packed in ordered structures which are reminiscent of crystalline material structures. For example, the spheres are packed in cube-like lattices with a centered body, and the cylinders in hexagonal lattices (FIG. 14.a). From this point of view, block copolymers constitute a class of amorphous materials in which the amorphism nevertheless has a structure similar to that of crystalline materials, with the major difference that the dimensions of the repeating units and the periodicity are not of the order of magnitude of angstroms (Å), as in crystals, but the dimensions of the microdomains into which the polymer blocks segregate (spheres, cylinders and lamellae) depend on the length of the blocks and, therefore, are of the order of magnitude of nanometers. Similarly, the periodicity of the microstructure depends on the molecular masses of the blocks. It is thus possible to regulate the size of the microdomains and the periodicity within fairly large ranges, from a few tens to several hundred of nanometers, by modifying the molecular masses of the blocks.

Typical living polymerization methods which are able to guarantee the formation of block copolymers are: living anionic, living cationic and controlled radical polymerization, polymerization catalysis by means of metathesis on metal-organic compounds. With these methods it is possible to obtain block copolymers with largely amorphous blocks and, even if crystalline, with a low melting point and poor mechanical properties.

Hitherto, the preparation of semi-crystalline block copolymers, which contain, for example, polyethylene blocks, has involved a somewhat elaborate and laborious synthetic process based on classic procedures involving living anionic polymerization, for example of butadiene, and subsequent selective hydrogenation of the polybutadiene.

However, recently novel catalytic systems have been described in literature on the subject, these being based on transition metal compounds, with bis(imino)phenoxide and aminophenoxide bonding agents, able to polymerize alpha-olefin monomers in a stereoselective manner and in particular able to produce block copolymers. Using these catalysts, copolymers containing crystallizable blocks of isotactic or syndiotactic polypropylene have been synthesized. This approach represents an extremely versatile method for synthesizing new molecular architectures and offers the possibility of access to a large number of different molecular topologies by varying co-monomers, molecular masses and stereoregularity of 1-olefin blocks. As a result it is possible to regulate and control the morphology and final structure of the block copolymers in a more efficient manner compared to the systems produced by means of anionic and/or radical polymerization and obtain greater control over the patterns which are to be formed.

The second characteristic of these systems that is exploited in the practice of an embodiment of this disclosure, consists in the possibility of using the ordered nanostructures formed by self-assembly as nanodomains (hosts) for the inclusion of guest molecules and an enhanced accumulation of conductive nanoparticles in the nanodomains. The different microdomains of the nanostructures generated by block copolymers (lamellae, spheres or cylinders) act as hosts for selectively sequestering nanofillers (guests) of suitable chemical and dimensional affinity.

The use, in a cross-point nanoarray, of an active organic film as separator between opposed electrodes belonging to the two orthogonal orders of electrodes, of a material comprising large-scale ordered nanostructures of block copolymer extending across the thickness of the organic film, instead of homopolymers, and in which polymeric blocks that form the nanostructures or domains have the ability of sequestering, because of enhanced chemical and physical affinity, conductive nanoparticles subtracting them from the surrounding organic matrix, provides a substantial predetermined anisotropy of the separation active organic film in terms of preferential electric current paths through the thickness of the active separator. This is extraordinarily effective in limiting the possibility that current flows, induced through the thickness of the organic film by localized biasing of the opposing electrodes at a certain cross-over point (array cell), may influence neighboring cross-point cells because of stray current paths extending laterally in the organic film, well beyond the perimeter of the projected cross over area of the two opposedly biased electrodes.

Moreover, conductive nanoparticles capable of inducing specific electric properties in the same organic material of the electrode separation film, since they are not randomly distributed in the organic matrix, but present largely in ordered nanodomains, increase the ability thereof to establish and control the final properties of the nanocompounds and ultimately the active organic film of the devices (cells).

FIG. 15 shows a TEM image of a nanocomposite based on a lamellar block copolymer in which gold nanoparticles are distributed in an ordered manner almost exclusively in specific domains of the organic material.

FIGS. 15 and 16 show, by way of example, TEM images of thin films of a copolymer polystyrene-b-polybutadiene-b-polystyrene and a star copolymer polystyrene-b-polyisoprene-b-polymethylmethacrylate. FIG. 15 shows cylinders of polybutadiene perpendicular to the surface of the film and packed in a hexagonal lattice within a polystyrene matrix, while FIG. 16 shows a pattern of rhombus-shaped polyisoprene microdomains packed in an orthorhombic lattice within a rigid matrix of polymethyl methacrylate.

One embodiment induces an effective orientation of the microdomains (e.g., "cylinders" parallel and perpendicular to the surface) and creates ordered structures on a nanometric scale, with an order which may extend to sufficiently large dimensions. This may be achieved by means of the application of an electric field, during phase separation in the organic mixture containing conductive nanoparticles dispersed within the organic mixture, during deposition and/or distribution thereof over the surface of electrodes predefined on the side of a substrate.

Various techniques for processing block copolymers able to obtain thin films (or research samples and bulk finishing) with ordered nanostructures comprise, for example, capillary extrusion, shearing, spin-coating, roll-casting, application of an electric field, application of a thermal gradient, directional solidification and interaction with electrode surfaces, making use in particular of topographic effects and epitaxial phenomena.

With the conventional methods for preparing block copolymers, based on the classic procedures of living anionic polymerization, it is difficult to obtain crystalline materials.

The presence of crystallinity is instead desirable because it enables, to a certain degree, control over the type of nanostructure to be obtained by means of phase separation, via crystallization control, using innovative technologies based on directional solidification from crystallizable solvents and epitaxial crystallization on suitable substrates [13][14]. By means of these techniques it is possible to induce orientation of the microdomains and crystalline phase and create long-radius ordered structures. The final morphology depends on competition between crystallization, phase separation and the molecular architecture.

Soft Lithography Techniques

Conventional lithography, based on the use of ultraviolet (UV) radiation sources, is the technology currently employed for the manufacture of electronic microdevices. The resolution of the structures which can be produced with this technology is limited by the wavelength of the radiation used, as well as by the cost of the process which is all the greater the smaller the structures which are to be produced. Moreover, with this technology the use of organic materials is particularly critical because they are typically prone to damage during the conventional lithographic steps.

As an alternative to conventional lithography, which uses radiation or electrons, soft lithography uses fairly simple mechanical processes such as molding, stamping and pressing [17][18]. This technology is becoming increasingly popular since it overcomes the limitation of optical diffraction, allowing structures to be produced which are smaller and, for the same dimensions, have a lower cost; with said technology the processing of organic materials is also possible [19].

All soft lithography techniques have in common the use of stamps made of polydimethysiloxane (PDMS), a "soft" material from which the name of the technology is derived.

In order to produce the stamp, a master is created using photolithography or electron beam lithography in order to create the desired pattern on a substrate made of silicon, silica or other material. The chemical precursor of the PDMS is poured onto the master and is polymerized so as to obtain the solid PDMS stamp.

The manufacture of the master is the most costly part of the process. However, the stamp obtained may be used several times and the technology which uses this stamp is much less costly than photolithography.

Moreover, the same master may be used several times in order to produce several stamps (at least 50).

Figure 18:
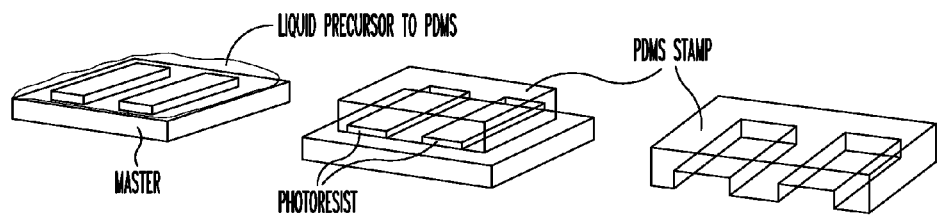
FIG. 18 illustrates the manufacture of a PDMS stamp.

FIG. 18 shows schematically the steps involved in manufacture of a PDMS stamp from a master.

In order to manufacture the stamp, it is possible to use also other types of polymers such as polyurethanes, polyamides or thermosetting resins, although PDMS remains the polymer of greatest interest. PDMS is in fact resistant and elastic at the same time owing to its siloxanic inorganic structure and the presence of methylene groups attached to this structure.

The PDMS starting precursor is liquid at room temperature and therefore able to permeate perfectly the channels in the master. Upon addition of the activator, which consists in a mixture of a complex formed by platinum and methylhydroxysilane and dimethylsiloxane copolymers, the precursor hardens rapidly, thus being transformed into an elastic solid.

Before using the precursor, it is suggested performing a master silanization treatment which may be performed by means of a vapor of $CF_3(CF_2)_6(CH_2)_2SiCl_3$. The purpose of this treatment is to reproduce more accurately the structures of the master in the stamp and also preserve the master for subsequent use.

Elastomer materials such as PDMS allow easy release of the stamp once manufactured, even if large areas are involved.

The main advantages offered by PDMS are summarized below [18]:

- it has a low free interfacial energy and good chemical stability: the molecules or polymers used during the soft lithography process do not react with the surface of the stamp;
- it does not absorb moisture and therefore does not require special monitoring of the working environment;
- it allows the gas molecules to pass through very easily, thus allowing also processing of prepolymers which during the reaction phase develop gas molecules;
- it has a good thermal stability (up to about 186° C. in air), allowing processing of the prepolymers by means of thermal polymerization treatment;
- it is optically transparent so that it allows processing also of prepolymers which can be polymerized with UV;
- owing to its elasticity properties the stamp may be deformed mechanically so as to favor the release of the patterned structures;
- it has excellent durability;
- it may undergo surface treatment for adaptation to specific materials to be used.

Together with its advantages, PDMS also has a certain number of drawbacks:

- plasticization occurs in the presence of apolar solvents such as toluene and hexane;
- it is subject to 1% shrinkage after polymerization;
- because of its elasticity and thermal expansion it is difficult to guarantee accuracy over large areas, especially in the case of multilayer manufacturing processes;
- the softness limits the ratio between height h and width/of the channels in the stamp (h/l ratio of between 0.2 and 2).

A description is now given of various soft lithography techniques which may be used and to which reference will be made to below in the remainder of the description of embodiments of cross-point nanoarrays according to the present disclosure.

Microcontact Printing

Figure 19:
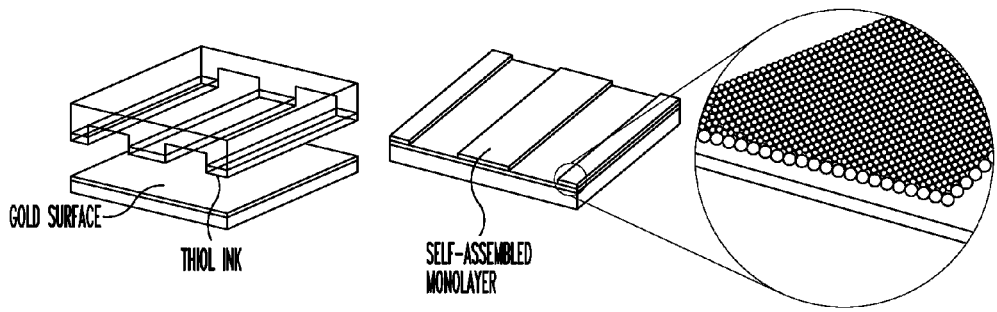
FIG. 19 illustrates the technique of microcontact printing a SAM of thiols on a gold substrate.

The technique of microcontact printing uses relief patterns in the PDMS stamp to transfer a self-assembled monolayer (SAM) onto the surface of a substrate by means of contact, as shown in FIG. 19.

Microcontact printing differs from other similar stamping techniques owing to the use of self-assembly molecules. These molecules have the property of aggregating spontaneously into stable and well-defined structures by means of non-covalent interaction.

Typically molecules consisting of an alkyl chains terminating in a polar head are used as self-assembly molecules. An example are alcanthiols: in this case the polar head consists of a sulfur atom.

The thickness of a SAM may be adjusted depending on the length of the alkyl chain.

SAMs have very interesting characteristics such as ease of preparation, good stability at the contemplated processing conditions and in particular a low defect density in the final structure.

The best SAM systems are those which are obtained by using alcanthiols, as self-assembly molecules, and gold or silver, as the substrate on which these monolayers are to be deposited. Other numerous combinations of self-assembly layers and substrates are nevertheless described [17].

Figure 20:
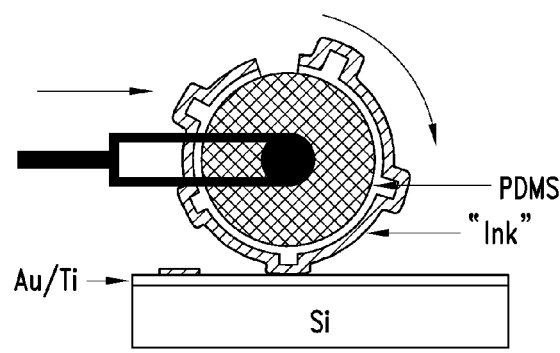
FIG. 20 illustrates the technique of microcontact printing using a cylindrical stamp.

The microcontact printing technique has, moreover, the advantage of large-scale patterning of surfaces by means of a rolling cylinder stamp, as shown in FIG. 20.

A SAM pattern deposited by means of microcontact printing may be used as a mask for performing selective etching of the substrate. In fact, the exposed part is etched while the part covered by the SAM is protected.

Generally a SAM has a thickness of a few nanometers so that the choice of the solution to be used for etching is crucial since the SAM must be protected from etching itself. For this reason, a number of solutions suitable both for the particular SAM and for the particular substrate used have been identified.

After etching the metal zones not protected by the SAM, a metal pattern is obtained, situated underneath the SAM pattern which is subsequently removed.

Using the microcontact printing technique it is possible to provide structures with a minimum dimension of less than 100 nm.

Figure 21:
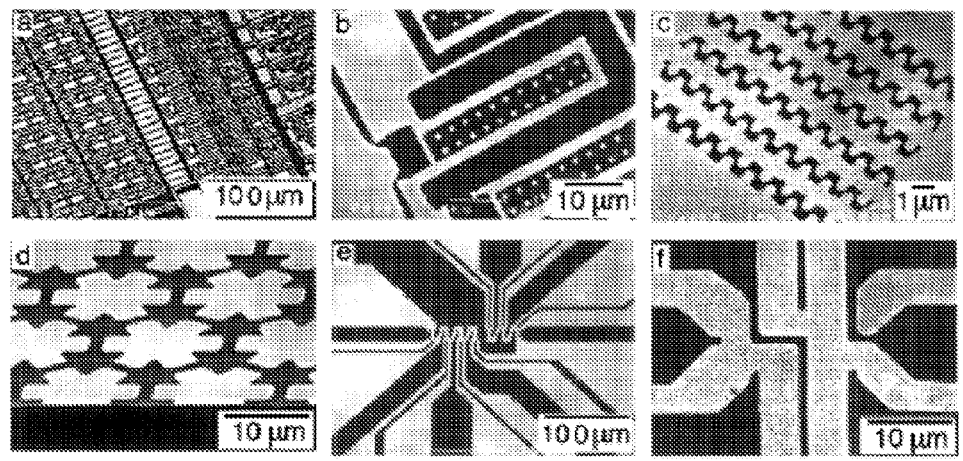
FIG. 21 shows SEM images of Ag patterns (a-c: 50 nm; d: 200 nm thickness); Au (e: 20 nm thickness); Cu (f: 50 nm thickness) obtained by means of SAMs of hexadecanthiols. The patterns a) and b) were obtained using cylindrical stamps, while the patterns c) to f) were obtained with flat stamps.

FIG. 21 shows SEM images of a variety of metal patterns with a thickness of between 20 and 200 nm obtained by means of SAM of hexadecanthiols. The patterns a) and b) were obtained using a cylindrical stamp, while the remaining patterns c) to f) were obtained using a flat stamp.

Alternatively the SAM patterns, deposited by means of microcontact printing, may be used as templates for the selective deposition of a wide variety of materials such as polymers, inorganic salts, metals and ceramic materials [18].

Micromolding

Differently from the technique of microcontact printing, micromolding uses the channels in the PDMS mold.

Within this technique there are a number of variants such as replica molding (REM), microtransfer tolding (μMT), micromolding in capillaries (MIMIC), solvent-assisted micromolding (SAMIM) and lastly embossing and injection molding.

Those techniques to which reference is made in the specific case of the present patent proposed are now described in detail.

Microtransfer molding (μTM) is an effective method for duplicating the information contained on the surface of the mold. The channels in the mold are filled with the material to be patterned and, after cleaning the excess material from the mold, the latter is turned over and placed on the substrate. In the case of a prepolymer, hardening of the material is achieved by means of heat or UV treatment.

Figure 22:
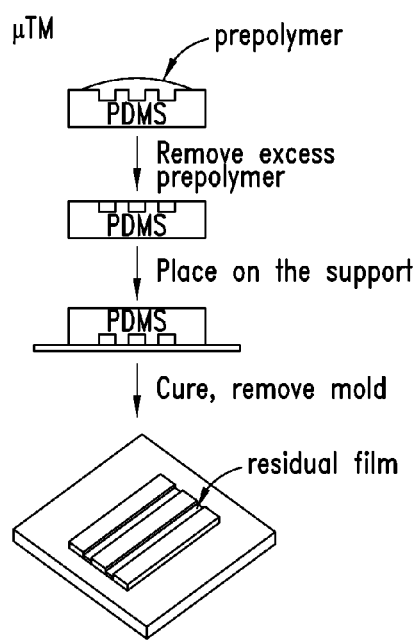
FIG. 22 shows the formation of patterns of a polymer material (in black) by means of the microtransfer molding technique.

FIG. 22 illustrates schematically the method of using the mold in the case of μTM.

With this technique it is possible to perform molding also on non-continuous surfaces since the material to be molded is supported directly by the mold before setting and is released from the mold only after polymerization has occurred.

Micromolding in Capillaries (MIMIC)

In the MIMIC technique the PDMS mold is placed on the surface of the substrate to be patterned and a low-viscosity liquid is deposited in the opening of the mold channels. This liquid penetrates by means of capillarity inside the channels and fills the entire mold. At this point the material is solidified by means of evaporation of the solvent, in the case of a solution, or by means of heat or UV ray treatment in the case of a prepolymer.

Figure 23:
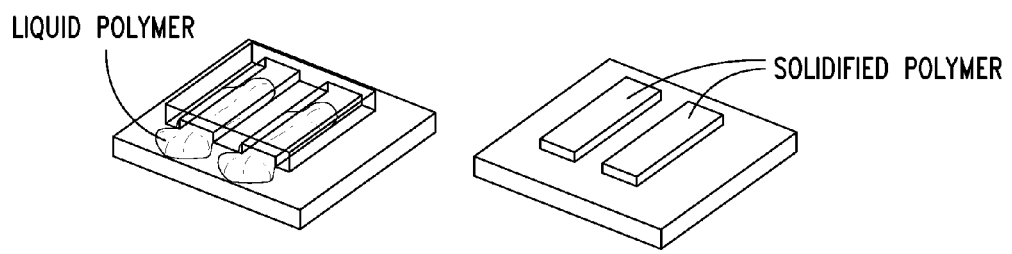
FIG. 23 shows the formation of patterns by means of MIMIC.

FIG. 23 illustrates schematically the technique of micromolding in capillaries [18].

The structures obtained with evaporation of the solvent are thinner than the thickness of the mold channels, while the width is instead maintained.

Figure 24:
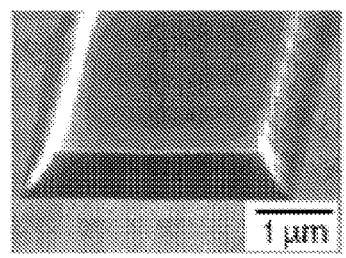
FIG. 24 is a SEM image of a PANI conductive strip.

By way of an example of this technique, FIG. 24 shows an SEM image of a conductive strip of polyaniline (PANI) obtained by means of MIMIC of a solution of undoped (and therefore soluble) polyaniline in N-methyl-2-pyrrolidone (NMP); following solidification by means of evaporation of the solvent, the material was brought into contact with an aqueous solution of HCl.

Patterning lines of conductive polymer materials, such as PANI, is particularly suitable for the low-cost manufacture of flexible and non-flexible, fully organic, electronic devices.

The technique has a number of drawbacks such as the need for continuity of the channels in order to favor filling of the mold, long filling times and difficult filling due to channels which are long and/or have small diameters. Although structures made with capillaries which have a diameter of less than 50 nm have been illustrated, it should be noted that the slow filling action could limit the usefulness of this technique; moreover with these diameters it is possible to fill only fairly short capillaries. It has been seen, however, that parallel lines of 100 nm diameter and 2 μm length are not subject to particular time restrictions or filling problems.

Among the aspects and advantages of the present disclosure the following deserve particular mention:

a) The use, as an active organic film separating two orthogonal orders of electrodes, of a material comprising oriented, nanostructured, block copolymers which extend across the thickness of the separation film, in which polymer blocks of the block copolymer domains or nanostructures sequester, on the basis of chemical and physical affinity, conductive nanoparticles dispersed in the surrounding organic matrix. This results in a substantial predetermined anisotropy of the separation film which is extraordinarily effective in limiting the possibility that current paths induced in the organic film by localized conditioning factors or agents at a certain cross-over point (matrix cell) may also be formed in neighboring zones of the organic film; and b) the possibility of achieving a high definition by means of soft lithography. As a result it is possible to achieve an extraordinary degree of compactness.

Theoretically each individual microdomain with the nanoparticles housed in it may form a separate memory element which is perfectly isolated from other adjacent domains and be directed by means of a pair of electrodes.

A method for manufacturing a nanoarray according to the disclosure using currently available techniques is now described by way of example.

Manufacture of Master and Stamp

Figure 25:
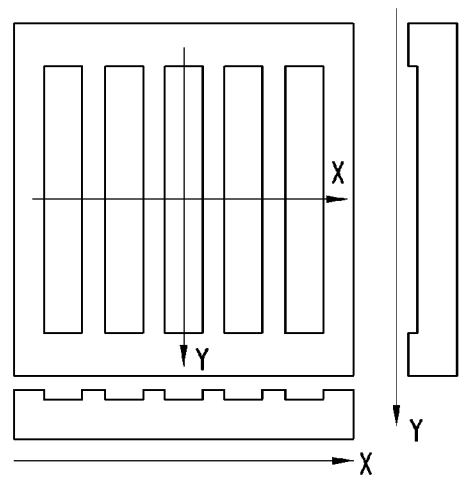
FIG. 25 shows a photomask for defining a pattern of parallel strips

The first step is to manufacture the master as a single piece formed with a pattern of parallel strips. This master may be manufactured either using an e-beam or by means of optical lithography and the photomask used is as shown in FIG. 25. In the case of structures which are not too small (~20 μm), the lithography process may be completely eliminated also during manufacture of the master. It is in fact possible to print directly a CAD pattern on a polymer sheet which may act as a mask one placed in contact with a photoresist [19].

Figure 26:
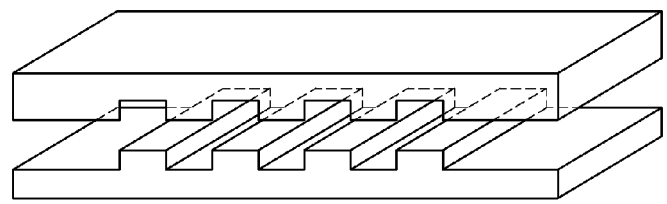
FIG. 26 illustrates the manufacture of the PDMS stamp.

The stamp consisting of polymer material (typically PDMS) is formed on the master using the procedure already described above and illustrated in FIG. 26.

Deposition of the Top and Bottom Electrodes

After manufacturing the stamp, deposition of the bottom electrodes is performed, followed by deposition of the active layer and the top electrode.

The electrodes are deposited using soft lithography techniques, such as microtransfer molding, micromolding in capillaries and microcontact printing.

It should be noted that, during successive depositions, each layer must be supported by the previous layer. It is possible to fill the empty spaces between the electrode strips of the underlying layer with a dielectric material. In order to fill these spaces, two possible methods may be used: a first possible method consists in depositing the dielectric material everywhere and then, by means of post-treatment, smoothing down until the height of the electrode strips is reached so as to expose the electrodes. A second possible method consists in filling these zones by means of the capillary effect using, for example, the non-patterned surface on the rear of the mold which is deposited on the electrode strips.

Deposition by Means of Microtransfer Molding

Figure 27:
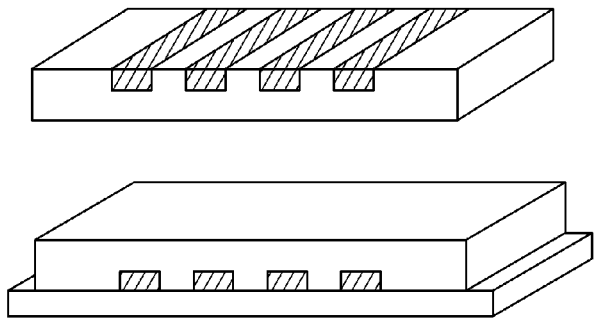
FIG. 27 illustrates the manufacture of self-aligned bottom electrode strips by means of the microtransfer molding technique.

In the case of microtransfer molding, the mold may be filled with the material for the electrode and then deposited on the substrate chosen for the device, as shown in FIG. 27.

After filling with dielectric the empty spaces present between the bottom electrode strips, deposition of the active layer based on block copolymers is performed, as will be described below, followed by deposition, using the same mold, of the top electrode strips by means of microtransfer molding or micromolding in capillaries. These strips are orthogonal with respect to the underlying strips and therefore there are no problems of alignment.

Deposition by Means of Micromolding in Capillaries (MIMIC)

Figure 28:
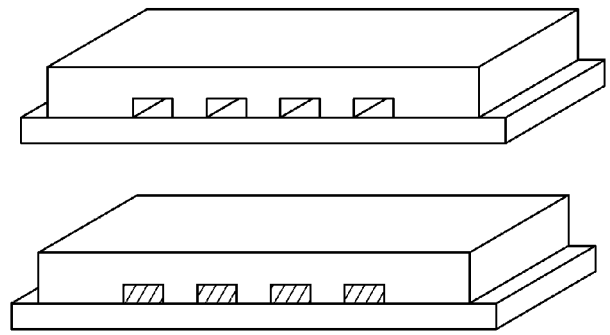
FIG. 28 illustrates the manufacture of self-aligned bottom electrode strips and active material film by means of the micromolding in capillaries technique.

In this case the mold is placed on the substrate and the electrode material is introduced in solution form inside the channels by means of the capillary effect, as shown in FIG. 28.

After hardening of this first layer, the reduction in thickness following hardening allows introduction, again by means of capillarity, of the solution of active material.

After hardening of this layer, the mold is removed from the substrate and the final structure obtained is the same as that described above.

At this point, deposition of the active layer based on block copolymers is performed, following by deposition of the top electrode strips using the same mold, by means of microtransfer molding or micromolding in capillaries.

Deposition of Self-Aligned Layers by Means of Microcontact Printing

Figure 29:
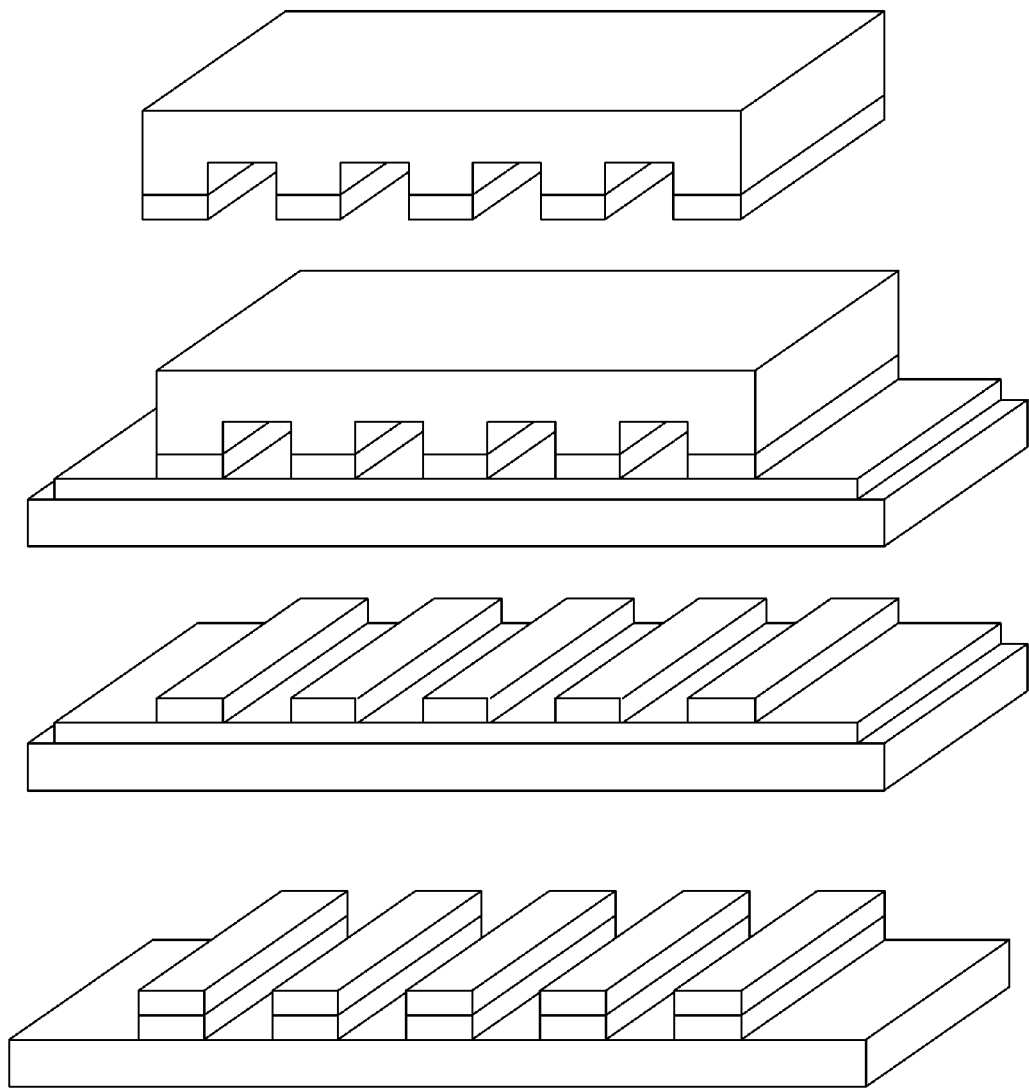
FIG. 29 illustrates the manufacture of bottom electrode strips by means of a thiol layer deposited using the microcontact printing technique.

In this case the relief parts of the mold are used to deposit SAMs (self-assembled monolayers) of thiols which are released by means of contact on the substrate previously lined with a layer of metal such as gold or silver. The pattern of thiols reproduces by means of chemical etching a metal pattern which consists precisely in metal strips which constitute the bottom electrodes. The method is illustrated in FIG. 29.

After hardening of the organic material, the top electrode strips are deposited using the same mold and once again without alignment problems since the strips to be deposited are orthogonal to those already deposited.

Dimensions

The final architecture is that of a dual-electrode memory array in which each individual memory cell has an area defined by the cross-over point of the two electrodes, i.e., bottom electrode and top electrode. Consequently, the minimum size of the memory cell is defined by the resolution of the Soft Lithography techniques used.

From literature on the subject it is known that the minimum dimensions which can be obtained with these techniques are dependent on the minimum dimensions of the master used to manufacture the mold.

Since the master may be manufactured using high-resolution techniques, such as e-beam or FIB technology, the minimum dimensions may be reduced to about 20 nm.

Obviously the minimum dimensions which may be actually achieved are also dependent on the material to be deposited and the complexity of the pattern.

From the point of view of the pattern, the architecture considered is fairly simple since it requires molds with parallel channels. It follows that, in general, memory arrays which can be scaled down to dimensions of 20 nm can be obtained.

In the case of micromolding in capillaries the minimum dimensions which can be reached with the current technology are slightly less, around 50 nm, owing to the difficulties in filling, by means of capillarity, channels which are tens of μm long.

In particular, if a diblock copolymer with a cylindrical morphology in which the cylinders are orthogonal to the plane of the polymer film and arranged in a hexagonal order is to be deposited as the active layer, the dimensions of the mold are dependent on the diameter of the cylinders which are obtained and the average interaxial distance. Therefore, the dimensions of the mold channels, and consequently of the electrodes, must lie within the range of 20-100 nm (in keeping with the cylinder diameter), while the distance between them must be in the range of 40-100 nm (a dimension which is compatible with the distance between the cylinders in an arrangement with a compact hexagonal cross-section).

In each film the cylinders obtained have practically all the same diameter, to within an error of 0.01%, and this also applies to the spacing separating them, which is always the same.

Figure 30:
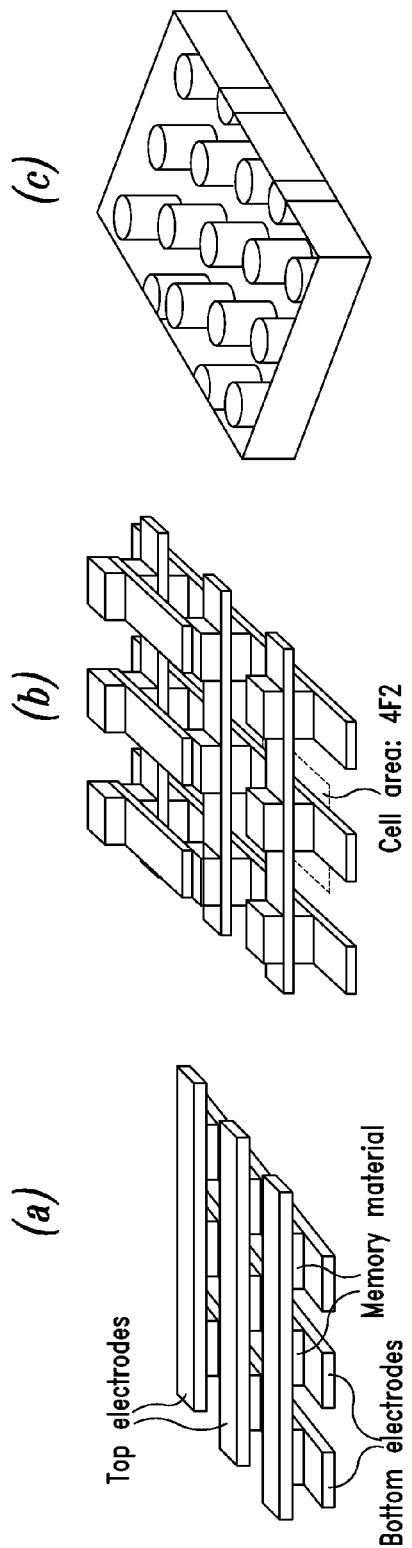
FIG. 30 shows a dual-electrode device with an active layer consisting of a block copolymer in which the cylinders contain passivated gold nanoparticles and an electron donor.

Moreover, in order to ensure alignment between the cylinders and the electrodes, the first electrode must be deposited at a distance from the edge, equal to the diameter of the cylinder, so as to make contact with the second row of cylinders in the pattern as shown in FIG. 30.

Materials

When choosing the materials, the compatibility of the solvents with the layers previously deposited and with the material of the mold must be assessed in each case.

In relation to the materials which can be used, it is also possible to fill the mold using solutions of precursors of the materials to be deposited. These solutions, owing to the minimum dimensions of the structures which are very critical, undoubtedly facilitate filling of the mold.

Using precursor solutions it is also possible to deposit metal electrodes by means of soft lithography techniques, such as microtransfer molding and micromolding in capillaries.

Top and Bottom Electrodes

In order to produce patterned polymer electrodes, for example a solution of PANI in m-cresol is deposited by means of casting or capillarity inside the PDMS mold [5]; alternatively a solution based on PEDOT (Poly-3,4-ethylenedioxythiophene) in water or particles of carbon in ethanol could be deposited [5,6].

Then the mold is overturned onto a conventional (silicon, glass, etc.) substrate or onto a flexible polymer (PET, PI, etc.) substrate and, after complete evaporation of the solvent, the mold is removed and may be reused, rotating it through 90°, for the second electrode, so as to obtain conductive strips perpendicular to those of the substrate.

In order to produce metal electrodes, in addition to the microcontact printing technique, it is possible to use solutions of inorganic metal precursors or even organic metal precursors such as mercapturic precursors. The latter are preferable because they do not require the presence of a further solution of reducing agents and simply make use of the temperature effect to decompose and form the metal. Moreover, by suitably choosing the organic part, it is possible to obtain precursors which are soluble in different types of solvents, this satisfying the need for the compatibility of the solvents with the mold and any other layers already deposited.

Active Organic Layer

The applicational potential of the block copolymers in surface patterning may be fully exploited if perfect orientation of the microdomains, in particular of the cylinders, perfectly parallel and perpendicular to the surface can be achieved. For this purpose, the application of an electric field and/or a thermal gradient, directional solidification and interaction with the surfaces of the two electrodes making use of topographical effects and epitaxy, are all techniques which have been successful in promoting the anisotropy of the active organic layer based on block copolymers with nanoparticles arranged in an ordered manner in the oriented nanostructures, i.e., in the example considered, in parallel cylinders perpendicular to the electrode surfaces.

For example, it is possible to deposit by means of a spin coater a solution of poly(styrene-b-methylmethacrylate) ((PS (47K)-b-PMMA(140K) with 47K and 140K being the molecular masses, expressed in Kdalton, of the PS and PMMA blocks, respectively) with gold nanoparticles passivated with naphthalenethiol (Au—NF NPs) from toluene on a substrate on which metal or organic electrodes have been deposited beforehand. In the case of the block copolymer considered, there is an excellent orientation of parallel cylinders of polystyrene in the thin deposited film, being perpendicular to the opposite surfaces of the (PS) electrodes separated by polymethylmethacrylate (PMMA). Moreover, the Au—NF conductive nanoparticles, by virtue of their chemical affinity with the PS, are distributed not randomly, but are preferentially sequestered in the ordered microdomains represented by the PS cylinders which are formed in the host mass of PMMA. In this way, the PS cylinders rich in Au—NF nanoparticles form current paths which can be activated by the electric field between the two electrodes of each resistive memory cell at the nanoarray cross-over point.

A sensor device, the response of which is triggered by a variation in the distance between nanostructures caused by the application of mechanical forces and is manifested by means of changes in the optical and/or electrical properties of the device, may comprise nanostructures based on block copolymers in which at least one block is rubbery and contains nanoparticles or clusters of nanoparticles of a conductive, semiconductive and/or ceramic material segregated into the domains of said rubbery blocks, the deformability of which under force produces variations in the distances between the nanostructures.

Hybrid devices with an organic matrix based on block copolymers in which at least one block can be crystallized, able to sequester nanoparticles or clusters of nanoparticles of conductive, semiconductive and/or ceramic materials and to be organized in nanostructures ordered on a large scale in the form of thin films, are useful as precursors for the construction of membranes for microfluid applications, nanostructured electrodes or resists, as well as circuit components integrated in large-area substrates with a high flexibility, mechanical strength and heat resistance, owing to the possibility of using crystallizable blocks with a high melting temperature (for example block copolymers containing blocks of isotactic and/or syndiotactic polypropylene).

BIBLIOGRAPHY

[1] Thomas Mikolajick, *The Future of Nonvolatile Memories*.
[2] Y. Segui, Bui Ai, H. Carchano, *Switching in polystyrene films: Transition from on to off state, J. Appl. Phys.* (1976), Vol. 47, No. 1, Pg. 140;
[3] J. Ouyang, C. Chu, C. R. Szmanda, L. Ma, Y. Yang, *Programmable polymer thin film and non-volatile memory device, Nature Materials* (2004), Vol. 3, Pg. 918;
[4] J. Ouyang, C. Chu, D. Steves, Y. Yang, *Electric-field-induced charge transfer between gold nanoparticle and capping 2-naphthalenethiol and organic memory cells, Appl. Phys. Lett.* (2005), Vol. 86, No. 12, Pg. 123507;
[5] Y. Yang, J. Ouyang, L. Ma, R. J. Tseng, C. Chu, *Electrical Switching and Bistability in Organic/Polymeric Thin Films and Memory Devices, Adv. Funct. Mater.* (2006), Vol. 16, Pg 1001;
[6] H. K. Henisch, W. R. Smith, *Switching in organic polymer films, Appl. Phys. Lett.* (1974), Vol. 24, No. 12, Pg. 589.
[7] G. H. Fredrickson, F. S. Bates, *Annu. Rev. Phys. Chem.* 1990, 41, 525. L. Leibler, *Macromolecules* 1980, 13, 1602.
[8] C. Park, J. Yoon, E. L. Thomas, *Enabling nanotechnology with self assembled block copolymer patterns Polymer* 2003, 44, 6725
[9] Ian W. Hamley in *Developments in Block Copolymers*, (Ian W. Hamley Ed.) Wiley: Chichester, 2005. Chap. 1, p. 1-29.
[10] P. Mansky, P. M. Chaikin, E. L. Thomas, *Monolayer films of diblock copolymer microdominis for nanolithographic applications. J. Mater. Sci.* 1995, 30, 1987. M. Park, C. K. Harrison, P. M. Chaikin, R. A. Register, D. H. Adamson, *Block copolymer lithography: periodic arrays of 1011 holes in 1 square centimeter. Science* 1997, 276, 1401
[11] M. Lazzari, M. A. Lopez Quintela, *Block copolymer as a tool for nanomaterial fabrication. Adv. Mater.* 2003, 15, 1583.
[12] M. Lazzari, C. De Rosa, Method for alignment and large area-scale ordering of block copolymer morphology. In "Block Copolymers in Nanoscience", M. Lazzari, G. Liu, S. Lecommandoux Eds., 2006 Wiley-VCH, Verlag GmbH & Co. Weinheim.
[13] De Rosa, C.; Park, C.; Thomas, E. L.; Lotz, B.; *Microdomini patterns via directional eutectic solidification and epitaxy, Nature* 2000, 405, 433.
[14] Thomas, E. L.; De Rosa, C.; Park, C.; Fasolka, M.; Lotz, B.; Mayes, A. M.; Yoon, J.; *Large area orientation of block copolymer microdominis in thin films*, U.S. Pat. No. 6,893, 705 2005.
[15] Coates, G. W.; Hustad, P. D.; Reinartz, S. Angew. Chem., Int. Ed. Engl. 2002, 41, 2236.
[16] M. Bockstaller, R. A Mickievic, E. L Thomas, *Block copolymer nanocomposites: Perspective for tailored functional materials. Adv. Mater.* 2005, 17, 1331.
[17] Marko Uplaznik, Review: *Introduction to nanotechnology—soft lithography*, March 2002.
[18] *Annu. Rev. Mater. Sci.* 1998. 28: 153-84.
[19] Younan Xia and George M. Whitesides, Soft Lithography, Angew. Chem. Int. Ed. 1998, 37, 550-575.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A cross-point cell nanoarray comprising:
a mechanical support substrate;
a first plurality of electrodes defined over an area of the substrate, the electrodes of the first plurality being substantially uniformly spaced and substantially parallel to each other;
a second plurality of electrodes substantially orthogonal to the electrodes of said first plurality, the electrodes of the second plurality being substantially uniformly spaced and substantially parallel to each other, the first and second pluralities of electrodes being configured to define cross-points each being a location at which a respective electrode of the first plurality of electrodes crosses a respective electrode of the second plurality of electrodes; and an active organic resin layer positioned between said first plurality of electrodes, the active organic resin layer having dispersed therein conductive nanoparticles and/or conductive nanoparticle clusters, said active organic resin layer comprising a matrix block copolymer of a major component resin and of at least one different minor component resin, the matrix block copolymer being configured to form large-scale ordered nanostructures through phase segregation due to block incompatibility and self-assembly properties of blocks of the matrix block copolymer, said ordered nanostructures of the matrix block copolymer being configured to sequester the conductive nanoparticles and/or conductive nanoparticle clusters by subtracting them from a surrounding matrix of the matrix copolymer, wherein said ordered nanostructures are parallel nanostructures, with axes substantially orthogonal to surfaces of the first plurality of electrodes that face corresponding surfaces of the second plurality of electrodes at the crossing points, and define preferential electric current paths across the active organic resin layer.

2. The cross-point cell nanoarray according to claim 1, wherein the parallel nanostructures are strings, cylinders, or tubes.

3. The cross-point cell nanoarray according to claim 1, wherein cross-sectional dimensions of said nanostructures range between a few tens and a few hundreds of nanometers.

4. The cross-point cell nanoarray according to claim 3, wherein said parallel nanostructures are closely packed with an average spacing between them of the order of a few tens of nanometers.

5. The cross-point cell nanoarray according to claim 1, wherein said ordered nanostructures are configured to sequester said nanoparticles and/or nanoparticle clusters in ordered domains of one of the component resins of the block copolymer and the surrounding matrix is of a different one of the component resins and is deprived of said nanoparticles and/or nanoparticle clusters.

6. The cross-point cell nanoarray according to claim 1, wherein said component resins have different molecular weights, and the matrix block copolymer includes amorphous blocks belonging to the group composed of polystyrene, polybutadiene, polyisoprene and polymethacrylate, produced with one or with a combination of polymerization mechanisms belonging to the group composed of living anionic, living cationic and controlled radical polymerization catalysis, polymerization catalysis by metathesis on metal-organic compounds and coordinative polymerization catalysis.

7. The cross-point cell nanoarray according to claim 1, wherein said resins comprise components with different molecular weights, and the matrix block copolymer includes crystalline blocks having melting temperatures higher than 110° C. and of a material belonging to the group composed of polyethylene, isotactic polypropylene and syndiotactic polypropylene obtained by stereo and regio selective coordinative polymerization on living metal-organic compounds and/or in combination with living anionic, living cationic, controlled radical polymerization methods and polymerization catalysis by metathesis on metal-organic compounds.

8. The cross-point cell nanoarray according to claim 1, wherein said conductive nanoparticles belong to the group composed of gold, platinum, silver, copper, nickel, alloys of said metals, blacks of the metals with a large specific surface area, carbon and carbon blacks, and have an average diameter of between 1 and 6 nanometers.

9. The cross-point cell nanoarray according to claim 1, wherein said conductive nanoparticles are gold passivated by treatment with a compound of the group composed of alkyl-thiols, aryl-thiols, 2-naphthalene ethiol, 1-dodecanthiol.

10. The cross-point cell nanoarray according to claim 1, wherein self-assembly of the ordered nanostructures is assisted by at least one physical conditioning parameter chosen from among a mechanical, electrical and/or thermal bias.

11. The cross-point cell nanoarray according to claim 1, wherein said electrodes are made of a conductive material belonging to the group composed of aluminum, copper, nickel, gold, platinum, alloys of at least one of these metals, doped polysilicon and silicide.

12. The cross-point cell nanoarray according to claim 1, wherein said pluralities of electrodes are defined by a soft lithography technique.

13. A non-volatile memory device comprising:
a cross-point cell nanoarray that includes:
a mechanical support substrate;
a first plurality of electrodes defined over an area of the substrate, the electrodes of the first plurality being substantially uniformly spaced and substantially parallel to each other;
a second plurality of electrodes substantially orthogonal to the electrodes of said first plurality, the electrodes of the second plurality being substantially uniformly spaced and substantially parallel to each other, the first and second pluralities of electrodes being configured to define cross-points each being a location at which a respective electrode of the first plurality of electrodes crosses a respective electrode of the second plurality of electrodes; and
an active organic resin layer positioned between said first plurality of electrodes, the active organic resin layer having dispersed therein conductive nanoparticles and/or conductive nanoparticle clusters, said active organic resin layer comprising a matrix block copolymer of a major component resin and of at least one different minor component resin, the matrix block copolymer being configured to form large-scale ordered nanostructures through phase segregation due to block incompatibility and self-assembly properties of blocks of the matrix block copolymer, said ordered nanostructures of the matrix block copolymer being configured to sequester the conductive nanoparticles and/or conductive nanoparticle clusters by subtracting them from a surrounding matrix of the matrix copolymer, wherein said ordered nanostructures are parallel nanostructures, with axes substantially orthogonal to surfaces of the first plurality of electrodes that face corresponding surfaces of the second plurality of electrodes at the crossing points, and define preferential electric current paths across the active organic resin layer.

14. The non-volatile memory device according to claim 13, wherein the parallel nanostructures are strings, cylinders, or tubes.

15. The non-volatile memory device according to claim 13, wherein said ordered nanostructures are configured to sequester said nanoparticles and/or nanoparticle clusters in ordered domains of one of the component resins of the block copolymer and the surrounding matrix is of a different one of the component resins and is deprived of said nanoparticles and/or nanoparticle clusters.

16. The non-volatile memory device according to claim 13, wherein said component resins have different molecular weights, and the matrix block copolymer includes amorphous blocks belonging to the group composed of polystyrene, polybutadiene, polyisoprene and polymethacrylate, produced with one or with a combination of polymerization mechanisms belonging to the group composed of living anionic, living cationic and controlled radical polymerization catalysis, polymerization catalysis by metathesis on metal-organic compounds and coordinative polymerization catalysis.

17. The non-volatile memory device according to claim 13, wherein said resins comprise components with different molecular weights, and the matrix block copolymer includes crystalline blocks having melting temperatures higher than 110° C. and of a material belonging to the group composed of polyethylene, isotactic polypropylene and syndiotactic polypropylene obtained by stereo and regio selective coordinative polymerization on living metal-organic compounds and/or in combination with living anionic, living cationic, controlled radical polymerization methods and polymerization catalysis by metathesis on metal-organic compounds.

18. A method, comprising:
forming cross-point cell nanoarray, the forming including:
forming a mechanical support substrate;
forming a first plurality of electrodes defined over an area of the substrate, the electrodes of the first plurality being substantially uniformly spaced and substantially parallel to each other;
forming a second plurality of electrodes substantially orthogonal to the electrodes of said first plurality, the electrodes of the second plurality being substantially uniformly spaced and substantially parallel to each other, the first and second pluralities of electrodes being configured to define cross-points each being a location at which a respective electrode of the first plurality of electrodes crosses a respective electrode of the second plurality of electrodes; and
forming an active organic resin layer positioned between said first plurality of electrodes, the active organic resin layer having dispersed therein conductive nanoparticles and/or conductive nanoparticle clusters, said active organic resin layer comprising a matrix block copolymer of a major component resin and of at least one different minor component resin, the matrix block copolymer being configured to form large-scale ordered nanostructures through phase segregation due to block incompatibility and self-assembly properties of blocks of the matrix block copolymer, said ordered nanostructures of the matrix block copolymer being configured to sequester the conductive nanoparticles and/or conductive nanoparticle clusters by subtracting them from a surrounding matrix of the matrix copolymer, wherein said ordered nanostructures are parallel nanostructures, with axes substantially orthogonal to surfaces of the first plurality of electrodes that face corresponding surfaces of the second plurality of electrodes at the crossing points, and define preferential electric current paths across the active organic resin layer.

19. The method of claim 18, wherein said forming the pluralities of electrodes includes defining the pluralities of electrodes by a soft lithography technique.

20. The method of claim 18, wherein said matrix block copolymer is formed by a catalytic system using transition metal compounds with phenoxide boding agents.

* * * * *